United States Patent
Yoon et al.

(10) Patent No.: US 11,690,252 B2
(45) Date of Patent: Jun. 27, 2023

(54) DISPLAY APPARATUS THAT INCLUDES CONCAVO-CONVEX STRUCTURE ON UPPER SURFACE OF PIXEL DEFINING LAYER AND METHOD OF MANUFACTURING THE SAME

(71) Applicant: Samsung Display Co., Ltd., Yongin-Si (KR)

(72) Inventors: Hyungguen Yoon, Yongin-si (KR); Hongyeon Lee, Yongin-si (KR); Sukhoon Kang, Yongin-si (KR); Heera Kim, Yongin-si (KR); Suji Park, Yongin-si (KR); Beomsoo Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 74 days.

(21) Appl. No.: 16/702,536

(22) Filed: Dec. 4, 2019

(65) Prior Publication Data
US 2020/0373364 A1  Nov. 26, 2020

(30) Foreign Application Priority Data
May 24, 2019 (KR) .......... 10-2019-0061452

(51) Int. Cl.
*H10K 59/122* (2023.01)
*H10K 71/10* (2023.01)
(Continued)

(52) U.S. Cl.
CPC ......... *H10K 59/122* (2023.02); *H10K 71/191* (2023.02); *G09G 3/3233* (2013.01); *H10K 59/1201* (2023.02)

(58) Field of Classification Search
CPC .......... H01L 27/3246; H01L 2227/323; H01L 51/56; H10K 59/122
See application file for complete search history.

(56) References Cited

U.S. PATENT DOCUMENTS 8,130,177 B2   3/2012  Nakatani et al.
9,818,811 B2 * 11/2017  Shin .................... H01L 51/5088
(Continued)

FOREIGN PATENT DOCUMENTS

KR   10-2017-0031912 A    3/2017
KR       10-1795428 B1   11/2017
(Continued)

OTHER PUBLICATIONS

Polymer Properties Database, Surface Properties of Polymers, https://polymerdatabase.com/polymer%20physics/SurfaceTension.html ("Surface Properties"), 2015-2021 polymerdatabase.com.

*Primary Examiner* — Mamadou L Diallo
(74) *Attorney, Agent, or Firm* — Innovation Counsel LLP

(57) ABSTRACT

A display apparatus includes a light-emitting device with improved reliability while maintaining liquid-repellent properties of peripheral layers after plasma irradiation. The display apparatus includes: a substrate; a pixel electrode disposed on the substrate; a pixel defining layer disposed on the pixel electrode and having an opening that exposes a central portion of the pixel electrode; and a liquid-repellent layer disposed on the pixel defining layer and having an upper surface having a concavo-convex structure.

8 Claims, 13 Drawing Sheets

(51) Int. Cl.
*H10K 59/12* (2023.01)
*G09G 3/3233* (2016.01)

(56) References Cited

U.S. PATENT DOCUMENTS

| | | | | |
|---|---|---|---|---|
| 2010/0164377 A1* | 7/2010 | Shimizu | ............. | H01L 27/3246 |
| | | | | 313/504 |
| 2011/0014389 A1* | 1/2011 | Ito | ....................... | H01L 51/0012 |
| | | | | 427/535 |
| 2014/0042402 A1* | 2/2014 | Prushinskiy | ........ | H01L 51/0013 |
| | | | | 438/23 |
| 2014/0295149 A1* | 10/2014 | Ito | ........................ | G03F 7/0388 |
| | | | | 428/195.1 |
| 2014/0329056 A1* | 11/2014 | Hou | ................... | H01L 51/0007 |
| | | | | 427/271 |
| 2019/0051712 A1* | 2/2019 | Yu | ........................... | H01L 51/56 |
| 2020/0075879 A1* | 3/2020 | Luo | .................... | H01L 51/0097 |

FOREIGN PATENT DOCUMENTS

| | | |
|---|---|---|
| KR | 10-1941178 B1 | 1/2019 |
| WO | 2009-113239 A1 | 9/2009 |
| WO | 2016-010077 A1 | 1/2016 |

\* cited by examiner

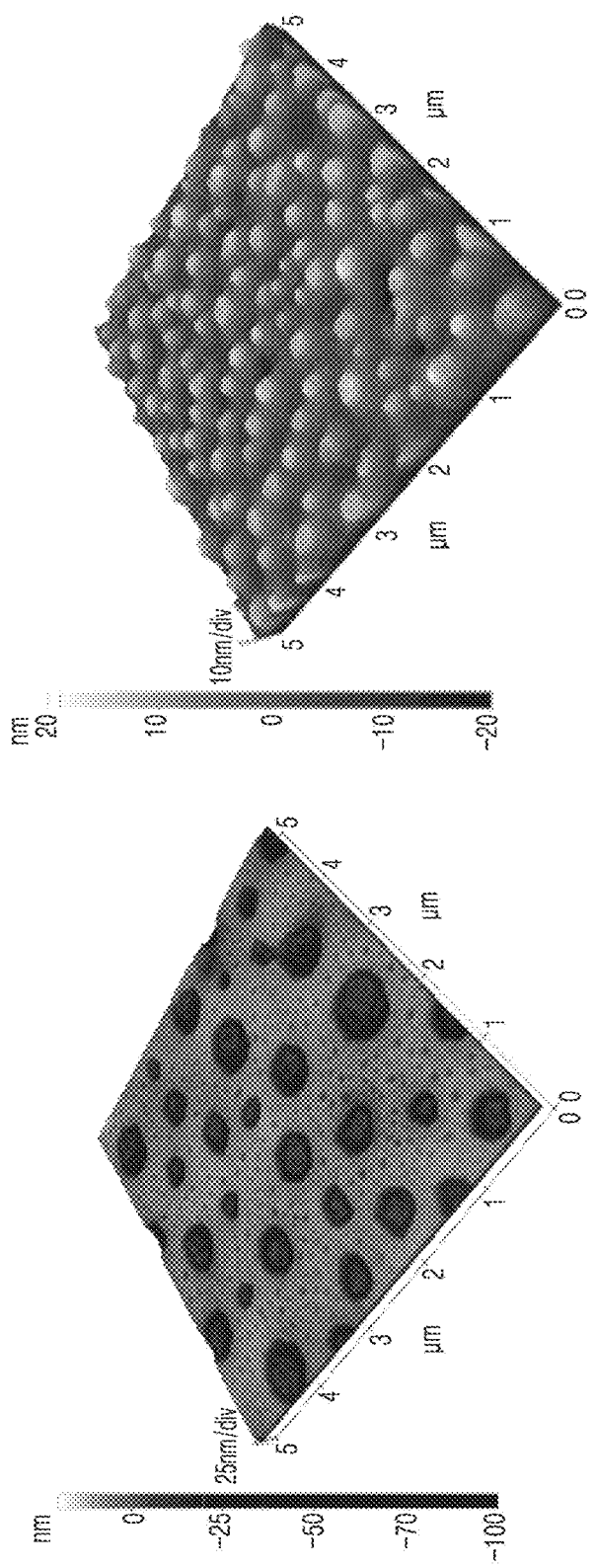

DISPLAY APPARATUS THAT INCLUDES CONCAVO-CONVEX STRUCTURE ON UPPER SURFACE OF PIXEL DEFINING LAYER AND METHOD OF MANUFACTURING THE SAME

CROSS-REFERENCE TO RELATED APPLICATION

This application claims the benefits of Korean Patent Applications No. 10-2019-0061452, filed on May 24, 2019, in the Korean Intellectual Property Office, the disclosure of which is incorporated herein in its entirety by reference.

BACKGROUND

1. Field

The present disclosure relates to a display apparatus and a method of manufacturing the display apparatus, and more particularly, to a display apparatus in which reliability of a light-emitting device is improved while maintaining liquid-repellent properties of peripheral layers, and a method of manufacturing the display apparatus.

2. Description of Related Art

Among various display apparatuses, organic light-emitting display apparatuses have been highlighted as next-generation display apparatuses owing to their wide viewing angles, high contrast, and fast response speeds.

In general, in an organic light-emitting display apparatus, thin-film transistors and organic light-emitting diodes are formed on a substrate, and the organic light-emitting diodes emit light by themselves. An organic light-emitting display apparatus may be used as a display apparatus having a small size such as a mobile phone, or as a display apparatus having a large size such as a television.

An organic light-emitting diode (OLED) includes a pixel electrode, an opposite electrode, and an organic light-emitting layer between the pixel electrode and the opposite electrode. The organic light-emitting layer of the organic light-emitting diode may be formed in various manufacturing processes for example, a chemical vapor deposition (CVD) method, an inkjet printing method, etc.

SUMMARY

In a display apparatus according to the related art, when an organic light-emitting layer is formed by an inkjet printing method, peripheral layers of a light-emitting region may have a liquid-repellent property, but the liquid-repellent property of the peripheral layers may degrade due to some of manufacturing processes.

One or more embodiments of the present disclosure include a display apparatus having improved reliability in a light-emitting device while maintaining a liquid-repellent property of peripheral layers and a method of manufacturing the display apparatus. However, the above technical feature is exemplary and the scope of the present disclosure is not limited thereto.

Additional aspects will be set forth in part in the following description and, in part, will be apparent from the description, or may be learned by practice of the presented embodiments of the present disclosure.

According to one or more embodiments, a display apparatus includes: a substrate; a pixel electrode disposed on the substrate; a pixel defining layer disposed on the pixel electrode; and a liquid-repellent layer disposed on the pixel defining layer. The pixel defining layer has an opening that exposes a central portion of the pixel electrode. The liquid-repellent layer has an upper surface having a concavo-convex structure.

The liquid-repellent layer may include a first liquid-repellent layer and a second liquid-repellent layer, wherein the second liquid-repellent layer may be located on the first liquid-repellent layer, the first liquid-repellent layer may include a first liquid-repellent agent, and the second liquid-repellent layer may include a second liquid-repellent agent.

The first liquid-repellent agent may have a first surface energy that is different from a second surface energy of the second liquid-repellent agent.

A first surface energy of the first liquid-repellent agent may be greater than a second surface energy of the second liquid-repellent agent.

Each of the first liquid-repellent agent and the second liquid-repellent agent may have a surface energy of 15 dyne/cm or less, and a first surface energy of the first liquid-repellent agent may be greater than a second surface energy of the second liquid-repellent agent by 4 dyne/cm to 10 dyne/cm.

The liquid-repellent layer may include a polymeric material having a molecular weight between 8000 and 20000.

The polymeric material may have a main chain and a side chain, and a portion of the side chain may have a ratio between 20% and 30%.

The polymeric material may have a glass transition temperature (Tg) of 200° C. or less.

The liquid-repellent layer may have a thickness between 30 nm and 70 nm.

The concavo-convex structure may have a pattern in which a convex portion and a concave portion may be repeatedly arranged, and the convex portion may have a first width between 0.01 μm and 3 μm, and the concave portion may have a second width between 0.01 μm and 3 μm.

An upper surface of the first liquid-repellent layer may have a concavo-convex structure, and a portion of the second liquid-repellent layer may be present on the upper surface of the first liquid-repellent layer.

According to one or more embodiments, a method of manufacturing a display apparatus, the method includes: preparing a substrate; forming a pixel electrode on the substrate; forming a pixel defining layer on the pixel electrode; and forming a liquid-repellent layer on the pixel defining layer. The pixel defining layer has an opening that exposes a central portion of the pixel electrode. The liquid-repellent layer includes an upper surface having a concavo-convex structure.

The forming of the liquid-repellent layer may include: forming an organic material layer including an organic material for forming the pixel defining layer mixed with a first liquid-repellent agent and a second liquid-repellent agent having different surface energies from each other; baking the organic material layer and phase-separating the pixel defining layer, the first liquid-repellent agent, and the second liquid-repellent agent such that the first liquid-repellent agent and the second liquid-repellent agent are located on the pixel defining layer; irradiating plasma to remove a liquid-repellent layer remaining on an upper surface of the pixel electrode; and baking the pixel defining layer after the irradiating the plasma.

A first surface energy of the first liquid-repellent agent may be greater than a second surface energy of the second liquid-repellent agent.

The organic material mixed with the first and second liquid-repellent agents may contain 2 weight percentage (wt %) to 5 wt % of the first liquid-repellent agent and 0.5 wt % to 1 wt % of the second liquid-repellent agent.

In the phase-separating, the second liquid-repellent agent may be located on the first liquid-repellent agent.

The A concavo-convex structure may be formed on an upper surface of the liquid-repellent layer by removing at least a portion of the second liquid-repellent agent on the pixel defining layer after irradiating the plasma.

The concavo-convex structure may have a pattern in which a convex portion and a concave portion may be repeatedly arranged, and the convex portion may have a first width between 0.01 µm and 3 µm, and the concave portion may have a second width between 0.01 µm and 3 µm.

Each of the first liquid-repellent agent and the second liquid-repellent agent may have a surface energy of 15 dyne/cm or less, and a first surface energy of the first liquid-repellent agent may be greater than a second surface energy of the second liquid-repellent agent by 4 dyne/cm to 10 dyne/cm.

The liquid-repellent layer may have a thickness between 30 nm and 70 nm.

Other aspects, features, and advantages of the present disclosure will become better understood through the accompanying drawings, the claims, and the detailed description.

General and specific aspects of the present disclosure may be performed using one or more of systems, methods, computer-readable storage mediums, and/or any combinations thereof.

BRIEF DESCRIPTION OF THE DRAWINGS

The above and other aspects, features, and advantages of certain embodiments of the present disclosure will be more apparent from the following description taken in conjunction with the accompanying drawings, in which:

FIGS. 5A to 5B are diagrams showing a concavo-convex structure formed in an upper surface of a liquid-repellent layer in a display apparatus according to an embodiment;

DETAILED DESCRIPTION

Figure 1:
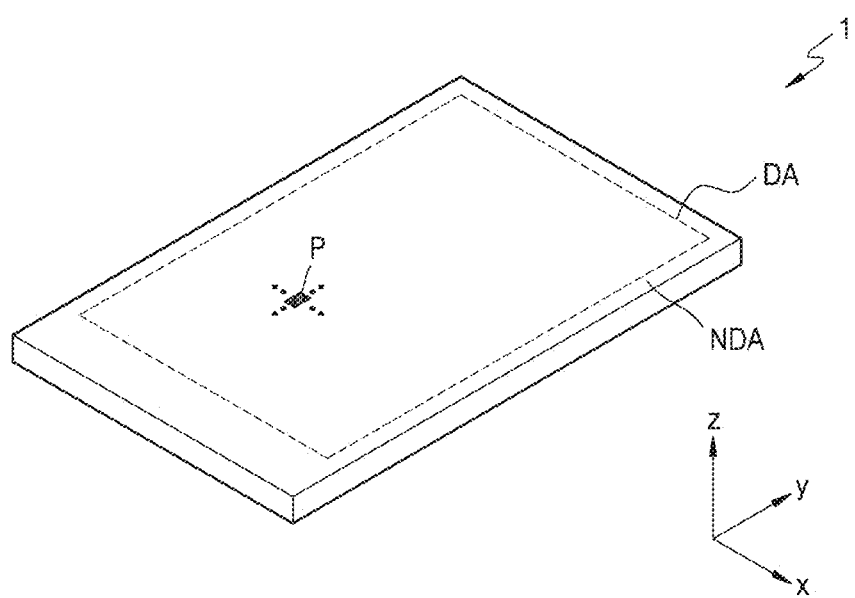
FIG. 1 is a perspective view of a display apparatus according to an embodiment.

Reference will now be made in detail to exemplary embodiments of the present disclosure that are illustrated in the accompanying drawings, wherein like reference numerals refer to like elements throughout. In this regard, the exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, may modify the list of elements and may not modify the individual elements of the list.

The example embodiments will be described below in more detail with reference to the accompanying drawings. Those components that are the same or are in correspondence are rendered the same reference numeral regardless of the figure number, and redundant explanations are omitted.

While such terms as "first," "second," etc., may be used to describe various components, and such components are not be limited to the above terms. The above terms are used only to distinguish one component from another.

An expression used in a singular form encompasses the expression of a plural form, unless it has a clearly different meaning in the context.

In the present specification, it is to be understood that the terms "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when a layer, region, or component is referred to as being "formed on" another layer, region, or component, it may be directly or indirectly formed on the other layer, region, or component. That is, for example, one or more intervening layers, regions, or components may be present therebetween.

Sizes of components in the drawings may be exaggerated for convenience of explanation. In other words, since sizes and thicknesses of components in the drawings are arbitrarily illustrated for convenience of explanation, the embodiments illustrated in the drawings are not limited thereto.

When a certain embodiment may be implemented differently, a specific process order may be performed differently from the described order. For example, two consecutively described processes may be performed substantially at the same time or performed in an order opposite to the described order.

In the specification, the phrase "A and/or B" denotes A, B, or A and B. In addition, the phrase "at least one of A and B" denotes A, B, or A and B.

In the embodiments described below, when layers, areas, elements. or the like are referred to as being "connected," it will be understood that they may be directly connected, or one or more intervening portions may be present between layers, areas or elements. For example, when layers, areas, elements, or the like are referred to as being "electrically connected," they may be directly electrically connected, or one or more layers, areas or elements may be indirectly electrically connected, and/or one or more intervening portions may be present.

The x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

Hereinafter, a display apparatus 1 according to an embodiment is described as an organic light-emitting display apparatus as an example, but the display apparatus 1 of the present disclosure is not limited thereto. In an embodiment, the display apparatus may include an inorganic light-emitting display, an inorganic electroluminescence (EL) display apparatus, or a quantum dot light-emitting display apparatus. For example, a light-emitting layer of a display element included in the display apparatus 1 may include an organic material, a quantum dot, or an organic material and a quantum dot.

FIG. 1 is a perspective view of the display apparatus 1 according to an embodiment.

Referring to FIG. 1, the display apparatus 1 includes a display area DA and a non-display area NDA, wherein the display area DA displays images and the non-display area NDA does not display images. The display apparatus 1 may provide images by using light emitted from a plurality of pixels P arranged in the display area DA.

In FIG. 1, the display area DA of the display apparatus 1 has a square shape, but the present disclosure is not limited thereto. The display area DA may have a circular shape, an ellipse shape, or a polygonal shape such as a triangle, a pentagon, etc. In addition, the display apparatus 1 of FIG. 1 is shown to include a flat panel, but the display apparatus 1 may be implemented as various types, e.g., a flexible display apparatus, a foldable display apparatus, a rollable display apparatus, etc. without deviating from the scope of the present disclosure.

Figure 2:
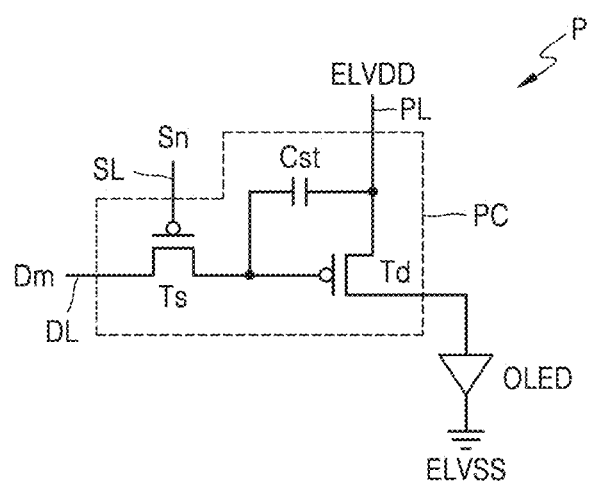
FIG. 2 is an equivalent circuit diagram of a pixel included in a display apparatus according to an embodiment.

FIG. 2 is an equivalent circuit diagram of a pixel included in the display apparatus 1 of the embodiment.

Referring to FIG. 2, the pixel P includes a pixel circuit PC connected to a scan line SL and a data line DL, and an organic light-emitting diode OLED connected to the pixel circuit PC.

The pixel circuit PC includes a driving thin film transistor Td, a switching thin film transistor Ts, and a storage capacitor Cst. The switching thin film transistor Ts is connected to the scan line SL and the data line DL and transfers a data signal Dm that is input through the data line DL to the driving thin film transistor Td according to a scan signal Sn that is input through the scan line SL.

The storage capacitor Cst is connected to the switching thin film transistor Ts and a driving voltage line PL and stores an amount of charge corresponding to a voltage difference between a voltage transferred from the switching thin film transistor Ts and a first power voltage ELVDD (or a driving voltage) that is input through the driving voltage line PL.

The driving thin film transistor Td is connected to the driving voltage line PL and the storage capacitor Cst and may control a driving current flowing from the driving voltage line PL to the organic light-emitting diode OLED in response to the voltage value stored in the storage capacitor Cst. The organic light-emitting diode OLED may emit light having a predetermined luminance according to the driving current.

FIG. 2 shows an example in which the pixel circuit PC includes two thin film transistors and one storage capacitor, but the present disclosure is not limited thereto. In an embodiment, the pixel circuit PC may include seven thin film transistors and one storage capacitor. In another embodiment, the pixel circuit PC may include two or more storage capacitors.

Figure 3:
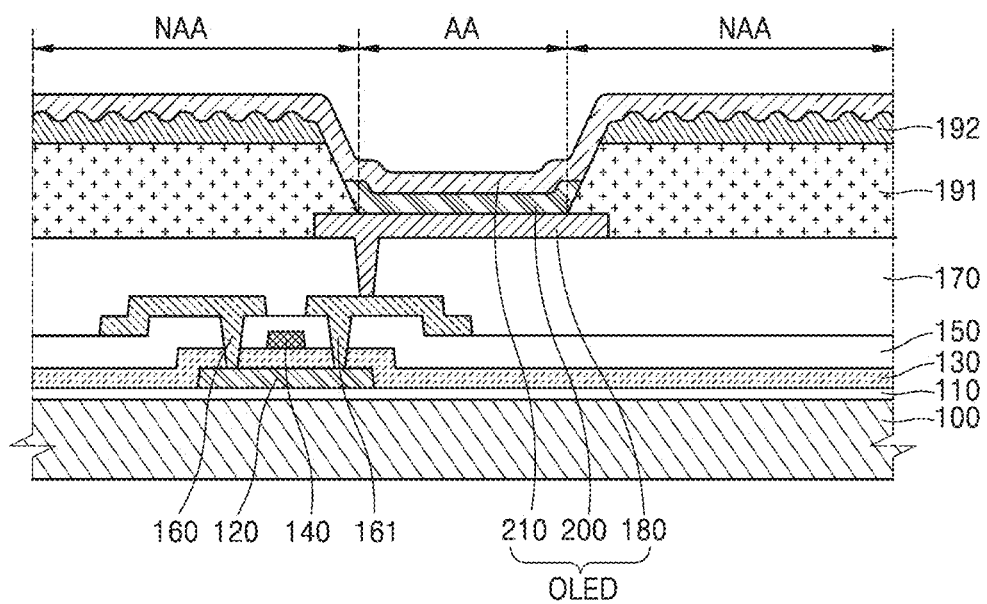
FIG. 3 is a cross-sectional view of a display apparatus according to an embodiment.

FIG. 3 is a cross-sectional view of the display apparatus 1 according to an embodiment.

Referring to FIG. 3, the display apparatus 1 according to the embodiment includes a substrate 100, a pixel electrode 180 disposed on the substrate 100, a pixel defining layer 191 disposed on the pixel electrode 180, wherein the pixel defining layer 191 has an opening that exposes a center portion of the pixel electrode 180, and a liquid-repellent layer 192 disposed on the pixel defining layer 191, wherein the liquid-repellent layer 192 has an upper surface with a concavo-convex structure.

The substrate 100 may include glass or a polymer resin. The polymer resin may be a transparent polymer resin including at least one of a polyether sulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), and cellulose acetate propionate (CAP). The substrate 100 including the polymer resin may be flexible, rollable, or bendable. The substrate 100 may have a multi-layered structure including a layer including the polymer resin and an inorganic layer (not shown).

A buffer layer 110 is disposed on the substrate 100 and planarizes an upper surface of the substrate 100 while preventing infiltration of impurities from the substrate 100. The buffer layer 110 may include at least one of silicon oxide (SiOx), silicon nitride (SiNx), and silicon oxynitride (SiOxNy).

An active layer 120 is disposed on the buffer layer 110. The active layer 120 may include oxide semiconductor and/or silicon semiconductor. When the active layer 120 includes oxide semiconductor, the active layer 120 may include oxide of a material including, but not limited to, indium (In), gallium (Ga), stannum (Sn), zirconium (Zr), vanadium (V), hafnium (Hf), cadmium (Cd), germanium (Ge), chrome (Cr), titanium (Ti), and zinc (Zn). For example, the active layer 120 may include an indium-tin-zinc-oxide ITZO (InSnZnO) active layer, an indium-gallium-zinc-oxide IGZO (InGaZnO) active layer, etc. When the active layer 120 includes silicon semiconductor, the active layer 120 may include amorphous silicon (a-Si) or low temperature polysilicon (LTPS).

The first insulating layer 130 is disposed on the buffer layer 110 covering the active layer 120. A gate electrode 140 is disposed on the first insulating layer 130 overlapping at least a portion of the active layer 120. For example, the gate electrode 140 may have a single or multi-layered structure including one or more metal selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 140 may be connected to a gate line (not shown) that provides an electrical signal to the gate electrode 140.

A second insulating layer 150 is disposed on the first insulating layer 130 covering the gate electrode 140. A source electrode 160 and/or a drain electrode 161 is disposed on the second insulating layer 150. The source electrode 160 and/or the drain electrode 161 may be electrically connected to the active layer 120 via respective contact holes that are formed in the second insulating layer 150 and the first insulating layer 130.

A third insulating layer 170 is disposed on the second insulating layer 150. In FIG. 3, the third insulating layer 170 is shown to have a single-layered structure, but the third insulating layer 170 may have a multi-layered structure in other embodiments. The third insulating layer 170 planarizes an upper surface of the pixel circuit PC to planarize a surface on which the organic light-emitting diode OLED is to be formed.

The third insulating layer 170 may include a general universal polymer including, but not limited to, benzocyclobutene (BCB), polyimide, hexamethyldisiloxane (HMDSO), polymethylmethacrylate (PMMA), and polystyrene (PS)), polymer derivatives having a phenol group, acryl-based polymer, imide-based polymer, aryl ether-based polymer, amide-based polymer, fluoride-based polymer, p-xylene-based polymer, vinyl alcohol-based polymer, and/or blends thereof. In an embodiment, the third insulating layer 170 may include an organic material and an inorganic material.

The pixel electrode 180 is disposed on the third insulating layer 170. The pixel electrode 180 may be a (semi-) transmissive electrode or a reflective electrode. The pixel electrode 180 may be electrically connected to the pixel circuit PC, for example, the drain electrode 161, via a contact hole formed in the third insulating layer 170.

In an embodiment, the pixel electrode 180 may include a reflective layer including, but not limited to, Ag, Mg, Al, Pt, Pd, Au, Ni, Nd, Ir, Cr, and a compound thereof, and a transparent or semi-transparent electrode layer disposed on the reflective layer. The transparent or semi-transparent electrode layer may include an electrode material including at least one of, but not limited to, indium tin oxide (ITO), indium zinc oxide (IZO), zinc oxide (ZnO), indium oxide ($In_2O_3$), indium gallium oxide, and aluminum zinc oxide (AZO). For example, the pixel electrode 180 may include a stack structure including ITO/Ag/ITO.

The pixel defining layer 191 is disposed on the pixel electrode 180. The pixel defining layer 191 has an opening corresponding to a light-emitting region AA that exposes a center portion of the pixel electrode 180 to define a light-emitting region of the pixel P. In addition, the pixel defining layer 191 increases a distance between an edge of the pixel electrode 180 and an opposite electrode 210 on the pixel electrode 180 to prevent generation of arc at the edge of the pixel electrode 180. The pixel defining layer 191 may include an organic insulating material such as polyimide, polyamide, an acrylic resin, benzocyclobutene (BCB), hexamethyldisiloxane (HMDSO), and a phenol resin, and may be obtained by a spin coating.

The liquid-repellent layer 192 having an upper surface of a concavo-convex structure is disposed on the pixel defining layer 191. The liquid-repellent layer 192 may grant a liquid-repellent characteristic to a non-light emitting region NAA, so that a light-emitting material is applied to the light-emitting region AA, but to the non-light emitting region NAA during a manufacturing process, for example, an inkjet printing process.

Figure 6:
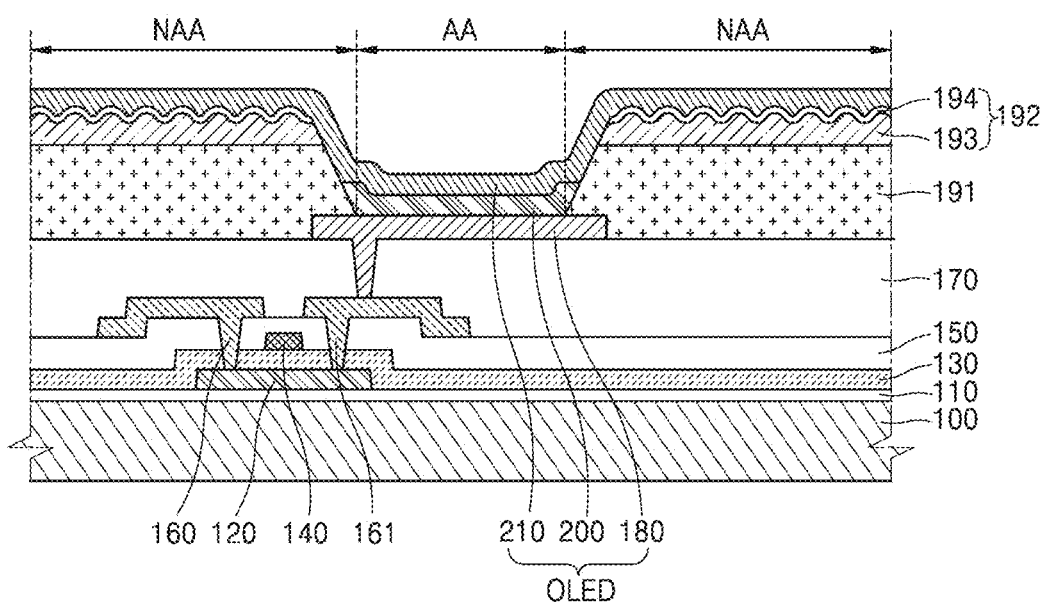
FIG. 6 is a cross-sectional view of a display apparatus according to an embodiment.
Figure 9:
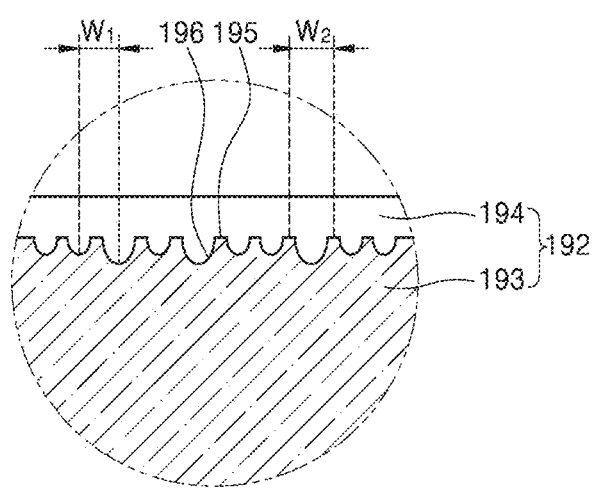

Referring to FIGS. 6 and 9, the liquid-repellent layer 192 may include a first liquid-repellent layer 193 including a first liquid-repellent agent, and a second liquid-repellent layer 194 including a second liquid-repellent agent disposed on the first liquid-repellent layer 193. Here, the first liquid-repellent agent included in the first liquid-repellent layer 193 and the second liquid-repellent agent included in the second liquid-repellent layer 194 have different surface energy from each other, and the surface energy of the first liquid-repellent agent may be greater than that of the second liquid-repellent agent. For example, the first liquid-repellent agent having a relatively higher surface energy may be contained from 2 weight percentage (wt %) to 5 wt % with respect to an organic material, and the second liquid-repellent agent may be contained from 0.5 wt % to 1 wt % with respect to the organic material.

The first liquid-repellent agent of the first liquid-repellent layer 193 and the second liquid-repellent agent of the second liquid-repellent layer 194 may each have a surface energy of 15 dyne/cm or less, and the surface energy of the first liquid-repellent agent may be greater than that of the second liquid-repellent agent by 4 dyne/cm to 10 dyne/cm.

The liquid-repellent agent included in the liquid-repellent layer 192 may include a polymeric material, in which a fluorine compound is fixed in an organic material such as polyimide. The polymeric material may have a main chain and a side chain of a molecular weight of 8000 to 20000. The polymeric material may have a side chain ratio of 20% to 30% to reduce a glass transition temperature (Tg) thereof to 200° C. or less while increasing mobility at a high temperature so that the liquid-repellent agent may be located above the pixel defining layer 191. Thus, the liquid-repellent agent may be easily located above the pixel defining layer 191 during a baking process.

In general, the glass transition temperature (Tg) may be adjusted via a cross-linking density between a resin of a photoresist layer PR (not shown) and the liquid-repellent agent, and to reduce the glass transition temperature (Tg), the side chain ratio may be decreased to reduce the cross-linking density of the resin in the photoresist layer PR and the liquid-repellent agent.

Figure 4A:
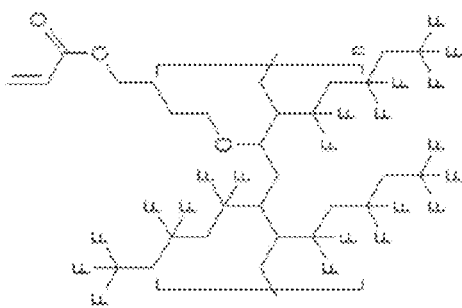
FIGS. 4A to 4C are diagrams illustrating a side-chain ratio of a liquid-repellent agent in a display apparatus according to an embodiment.
Figure 4B:
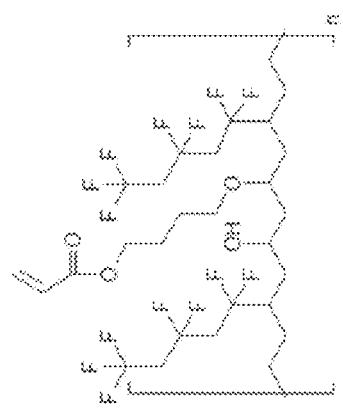
Figure 4C:
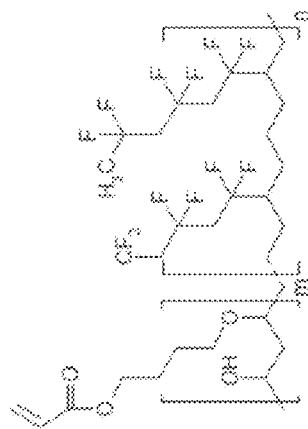

FIGS. 4A to 4C are diagrams illustrating a side-chain ratio of a liquid-repellent agent in the display apparatus 1 according to the embodiment.

In FIG. 4A, only one of four side chains has an acrylate reactor, therefore the side chain of 25% may be obtained. In FIG. 4B, when an acrylate precursor reacts with hydroxy (OH), a side chain of 25% may be obtained when the amount of the acrylate precursor is restricted to 50% or less of the OH site, and a side chain of 12.5% may be obtained when the amount of the acrylate precursor is restricted to 25% or less of the OH site. In FIG. 4C, the side chain ratio may be adjusted via a ratio between m and n. For example, when m and n have a ratio of 1:2 or greater, a side chain of 16.5% may be obtained.

According to the display apparatus 1 of the embodiment, the side chain of 20% to 30% of the liquid-repellent agent may be obtained by using a combination of at least one of FIGS. 4A, 4B, and 4C, and the glass transition temperature Tg of the polymeric material may be reduced to 200° C. or less, and thus, the liquid-repellent agent may be located easily above the pixel defining layer 191 during the baking process.

Due to a difference between the surface energy of the first liquid-repellent agent of the first liquid-repellent layer 193 and the surface energy of the second liquid-repellent agent of the second liquid-repellent layer 194, the second liquid-repellent agent may be located on the first liquid-repellent agent due to vertical separation. In addition, lateral separation between the first and second liquid-repellent agents may partially occur due to a Marangoni effect.

When the pixel defining layer 191 and the liquid-repellent layer 192 are formed, a remaining layer 181 (see FIG. 7) that is liquid-repellent may be on an upper surface of the pixel electrode 180. The remaining layer 181 remained on the upper surface of the pixel electrode 180 may affect a light-emitting efficiency and lifespan of the organic light-emitting diode OLED that includes an electron transport layer (ETL), a hole transport layer (HTL), and an emission layer (EML) formed on the pixel electrode 180 and the opposite electrode 210. Thus, the remaining layer 181 that has a liquid-repellent property and remained on the upper surface of the pixel electrode 180 may be removed by irradiating plasma thereto during a plasma cleaning process. However, the liquid-repellent layer 192 formed on the pixel defining layer 191 may also be removed by the plasma, and thus, the liquid-repellent characteristic may degrade.

In the display apparatus 1 according to the embodiment, the second liquid-repellent agent of the second liquid-repellent layer 194 serves as a sacrificial layer. Thus, the liquid-repellent layer 192 remains on the pixel defining layer 191 as shown in FIG. 3 even after the plasma cleaning process for removing the remaining layer 181 from the upper surface of the pixel electrode 180, and the liquid-repellent characteristic may be persisted or improved due to the liquid-repellent layer 192 remaining on the pixel defining layer 191.

FIGS. 5A and 5B are diagrams showing a concavo-convex structure formed in an upper surface of the liquid-repellent layer 192 in the display apparatus 1 according to an embodiment.

Referring to FIGS. 5A and 5B, since the lateral separation may partially occur on the liquid-repellent layer 192 due to the Marangoni effect, the second liquid-repellent agent on the pixel defining layer 191 is at least partially removed in the plasma cleaning process for removing the remaining layer 181 on the pixel electrode 180, and thus, a concavo-convex structure may be formed in the upper surface of the first liquid-repellent layer 193. The concavo-convex structure in the upper surface of the first liquid-repellent layer 193 has a pattern in which a convex portion and a concave portion are repeatedly arranged. The convex portion may have a width of 0.01 µm to 3 µm, and the concave portion may have a width of 0.01 µm to 3 µm. Since the concavo-convex structure is formed in the upper surface of the liquid-repellent layer 192, a surface roughness may increase to a range between 10 nm and 25 nm, and the liquid-repellent characteristic may be persisted or improved due to the liquid-repellent layer 192 remaining on the pixel defining layer 191.

FIG. 6 is a cross-sectional view of the display apparatus according to an embodiment.

Referring to FIG. 3 and FIG. 6, after the plasma cleaning is performed to remove the remaining layer 181 that remains on the pixel electrode 180, the second liquid-repellent agent of the second liquid-repellent layer 194 may be entirely removed, and only the first liquid-repellent agent may remain in the liquid-repellent layer 192 as shown in FIG. 3, or the second liquid-repellent agent may partially remain on the first liquid-repellent layer 193 as shown in FIG. 6.

The liquid-repellent layer 192 that remains on the pixel defining layer 191 may have a thickness of about 30 nm to about 70 nm.

An intermediate layer 200 is disposed on the portion of the pixel electrode 180 that is exposed via the pixel defining layer 191. The intermediate layer 200 may include an organic light-emitting layer, and one or more functional layers such as a hole transport layer (HTL), a hole injection layer (HIL), an electron transport layer (ETL), and an electron injection layer (EIL) may be selectively arranged under and on the organic light-emitting layer.

The organic light-emitting layer may include an organic material including, but not limited to, a fluorescent material or a phosphor material emitting red, green, blue, or white light. The organic light-emitting layer may include a low-molecular weight organic material or a polymeric material.

according to one embodiment, a plurality of pixel electrodes 180 is disposed arranged, and the intermediate layer 200 may correspond to each of the plurality of pixel electrodes 180. However, the present disclosure is not limited thereto. The intermediate layer 200 may be variously modified without deviating from the scope of the present disclosure. For example, the intermediate layer 200 may be arranged throughout the plurality of pixel electrodes 180. In an embodiment, the organic light-emitting layer may correspond to each of the plurality of pixel electrodes 180, and one or more functional layers except for the organic light-emitting layer may be arranged integrally throughout the plurality of pixel electrodes 180.

The opposite electrode 210 is disposed on the intermediate layer 200 and may extend to cover the liquid-repellent layer 192 as shown in FIG. 6. The opposite electrode 210 may be a transmissive electrode or a reflective electrode. In an embodiment, the opposite electrode 210 may be a transparent or a semi-transparent electrode, and may be provided as a metal thin film including at least one of Li, Ca, LiF/Ca, LiF/Al, Al, Ag, Mg, and a compound thereof having a small work function.

In an alternative embodiment, a transparent conductive oxide (TCO) such as ITO, IZO, ZnO, or $In_2O_3$ may be further provided on the opposite electrode 210. The opposite electrode 210 may be arranged throughout the display area DA and the non-display area NDA overlapping the intermediate layer 200 and the pixel defining layer 191. The opposite electrode 210 may be provided integrally with respect to a plurality of organic light-emitting diodes OLED and may correspond to the plurality of pixel electrodes 180.

When the pixel electrode 180 is a reflective electrode, and the opposite electrode 210 is a transmissive electrode, the light emitted from the intermediate layer 200 is emitted towards the opposite electrode 210. In this case, the display apparatus 1 may be a top emission type.

In an embodiment, when the pixel electrode 180 is a transparent or a semi-transparent electrode, and the opposite electrode 210 is a reflective electrode, the light emitted from the intermediate layer 200 is discharged towards the substrate 100. In this case, the display apparatus 1 may be a bottom emission type. However, the present disclosure is not limited thereto, that is, the display apparatus 1 according to an embodiment may be a dual-emission type that emits light towards both the front and back surfaces.

FIGS. 7 to 11 are cross-sectional views illustrating some of processes of manufacturing the display apparatus 1 according to an embodiment. FIG. 12 is a cross-sectional view illustrating some of processes of manufacturing the display apparatus 1, according to another embodiment. FIG. 13 is a cross-sectional view illustrating some of processes of manufacturing the display apparatus 1, according to another embodiment.

Hereinafter, a method of manufacturing the display apparatus 1 will be described in a processing order with reference to FIGS. 7 to 13.

Referring to FIGS. 7 to 11, the method of manufacturing the display apparatus 1 according to the embodiment may include preparing the substrate 100, forming the pixel electrode 180 on the substrate 100, forming the pixel defining layer 191 having an opening that exposes a center portion of the pixel electrode 180 on the pixel electrode 180, and forming the liquid-repellent layer 192 on the pixel defining layer 191. The liquid-repellent layer 192 has a concavo-convex structure on an upper surface.

A substrate composition for forming the substrate 100 may be applied onto a carrier substrate (not shown). The carrier substrate may be separated from the substrate 100 after all of the elements in the display apparatus 1 are stacked.

The substrate composition may include a precursor composition solution of a polyether sulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), etc.

In the preparing of the substrate 100, the substrate composition may be applied onto the carrier substrate and cured to form the substrate 100. For example, a polyamic acid composition solution may be cured to form a polyimide (PI) substrate.

Figure 7:
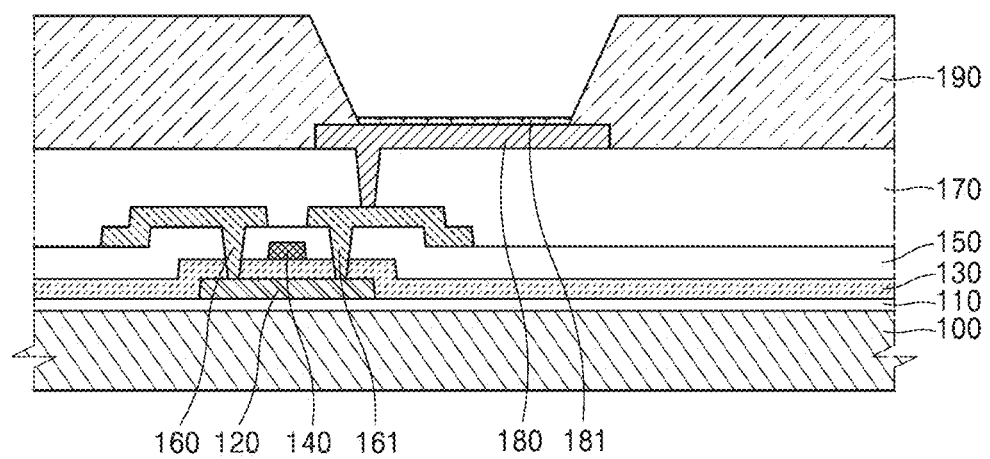
FIGS. 7 to 11 are cross-sectional views illustrating some processes of manufacturing a display apparatus, according to an embodiment.

Referring to FIG. 7, the buffer layer 110, the active layer 120, the first insulating layer 130, the gate electrode 140, the second insulating layer 150, the source electrode 160, the drain electrode 161, the third insulating layer 170, the pixel electrode 180, and the pixel defining layer 191 having the opening exposing the center portion of the pixel electrode 180 may be formed on the substrate 100. The above process may be performed through one or more photolithography processes that are well known in the art, and thus, detailed descriptions thereof are omitted.

After forming the pixel defining layer 191, the liquid-repellent layer 192 may be formed on the pixel defining layer 191. The liquid-repellent layer 192 has an upper surface having a concavo-convex structure. The liquid-repellent layer 192 may grant a liquid-repellent characteristic to a non-light emitting region NAA, so that a light-emitting material is not applied to the non-light emitting region NAA during an inkjet printing process.

The forming of the liquid-repellent layer 192 may include mixing an organic material of the pixel defining layer 191 with the first liquid-repellent agent and the second liquid-repellent agent. The first and second liquid-repellent agents may have different surface energy, phase-separating the pixel defining layer 191 from the first and second liquid-repellent agents so that the first and second liquid-repellent agents are formed above the pixel defining layer 191, irradiating plasma to remove the remaining layer 181 that is liquid-repellent from the upper surface of the pixel electrode 180, and baking the pixel defining layer 191 after the plasma cleaning process.

Referring back to FIG. 7, an organic material layer 190 may be disposed on the pixel electrode 180 by using a mixture of the organic material for forming the pixel defining layer 191 with the first and second liquid-repellent agents having different surface energy from each other. The organic material layer 190 is a layer in which a photoresist material, the organic material, and the first and second liquid-repellent agents are mixed and may serve as the pixel defining layer 191 defining the pixel region.

Between the first and second liquid-repellent agents that are mixed with the organic material for forming the pixel defining layer 191, the surface energy of the first liquid-repellent agent may be greater than that of the second liquid-repellent agent. In one embodiment, the first liquid-repellent agent having a relatively higher surface energy may be contained from 2 wt % to 5 wt % with respect to the organic material and the second liquid-repellent agent having a relatively lower surface energy may be contained from 0.5 wt % to 1 wt % with respect to the organic material.

The first liquid-repellent agent of the first liquid-repellent layer 193 and the second liquid-repellent agent of the second liquid-repellent layer 194 may each have a surface energy of 15 dyne/cm or less, and the surface energy of the first liquid-repellent agent may be greater than that of the second liquid-repellent agent by 4 dyne/cm to 10 dyne/cm.

The liquid-repellent layer 192 may include a polymeric material, in which a fluorine compound is fixed in an organic material such as polyimide. The polymeric material may have a main chain and a side chain of a molecular weight of 8000 to 20000. The polymeric material may have a side chain ratio of 20% to 30% to reduce a glass transition temperature (Tg) thereof to 200° C. or less while increasing mobility at a high temperature so that the liquid-repellent agent may be located above the pixel defining layer 191. Thus, the liquid-repellent agent may be easily located above the pixel defining layer 191 during a baking process.

After the mixing of the organic material for forming the pixel defining layer 191 with the first and second liquid-repellent agents, the organic material layer 190 is baked, and the pixel defining layer 191, the first liquid-repellent agent, and the second liquid-repellent agent may be phase-separated so that the first and second liquid-repellent agents are moved upwardly onto the pixel defining layer 191.

Figure 8:
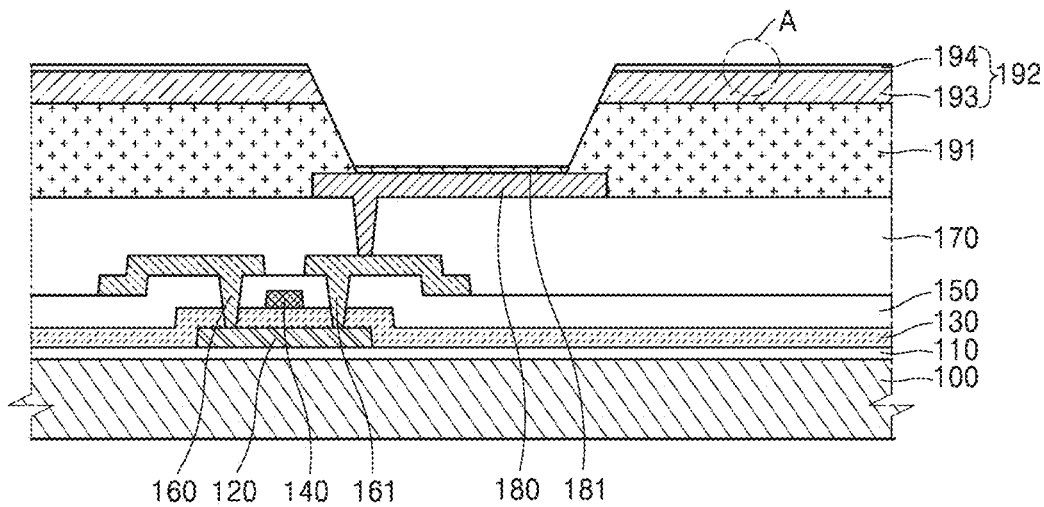

Referring to FIG. 8, in a phase-separation process, the organic material layer 190 is baked so that the first and second liquid-repellent agents may be moved onto the pixel defining layer 191, and the second liquid-repellent agent having relatively lower surface energy is moved onto the first liquid-repellent agent so that the first liquid-repellent layer 193 including the first liquid-repellent agent and the second liquid-repellent layer 194 including the second liquid-repellent agent may be vertically separated from each other.

In addition, in the phase-separation process, the second liquid-repellent agent is moved onto the first liquid-repellent agent (vertical separation), and the lateral separation partially occurs due to the Marangoni effect because the surface energy of the first liquid-repellent agent is greater than that of the second liquid-repellent agent. FIG. 9 shows a magnified view of an area A in FIG. 8. Due to the vertical and lateral separation, the liquid-repellent layer 192 may have a concavo-convex structure in a boundary surface between the first liquid-repellent layer 193 including the first liquid-repellent agent and the second liquid-repellent layer 194 including the second liquid-repellent agent. The concavo-convex structure formed in the boundary surface between the first liquid-repellent layer 193 and the second liquid-repellent layer 194 may have a pattern including a convex portion 195 and a concave portion 196 that are repeatedly arranged. A width $W_1$ of the convex portion 195 may be about 0.01 μm to 3 μm, and a width $W_2$ of the concave portion 196 may be about 0.01 μm to about 3 μm.

Figure 10:
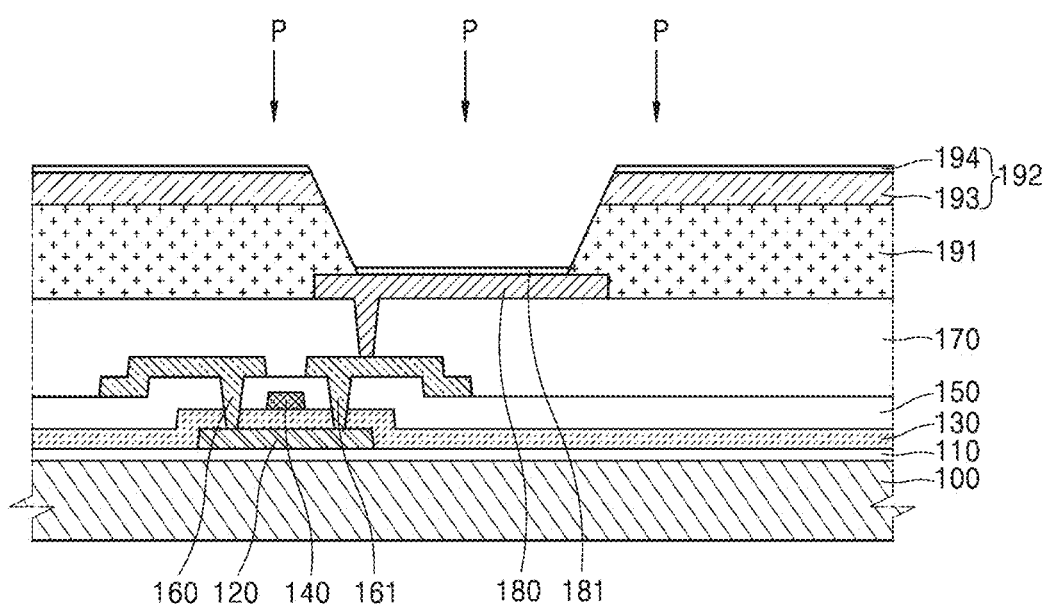

Referring to FIG. 10, when the pixel defining layer 191 and the liquid-repellent layer 192 are formed, the remaining layer 181 may remain on an upper surface of the pixel electrode 180. The remaining layer 181 remained on the upper surface of the pixel electrode 180 may affect a light-emitting efficiency and lifespan of the organic light-emitting diode OLED that includes an electron transport layer (ETL), a hole transport layer (HTL), and an emission layer (EML) formed on the pixel electrode 180 and the opposite electrode 210. Thus, the remaining layer 181 remained on the upper surface of the pixel electrode 180 may be removed by irradiating plasma P thereto during a plasma cleaning process. However, the liquid-repellent layer 192 formed on the pixel defining layer 191 may also be removed by the plasma for removing the remaining layer 181 from the upper surface of the pixel electrode 180, and thus, the liquid-repellent characteristic may degrade.

In the display apparatus 1 according to the embodiment, the second liquid-repellent agent serves as a sacrificial layer. Thus, the liquid-repellent layer 192 remains on the pixel defining layer 191 even after the plasma cleaning process for removing the remaining layer 181 from the upper surface of the pixel electrode 180, and the liquid-repellent characteristic may be maintained due to the liquid-repellent layer 192 remaining on the pixel defining layer 191.

Referring to FIGS. 5A and 5B, since the lateral separation may partially occur on the liquid-repellent layer 192 due to the Marangoni effect, the second liquid-repellent agent on the pixel defining layer 191 is at least partially removed in the plasma cleaning process for removing the remaining layer 181 from the upper surface of the pixel electrode 180, and thus, a concavo-convex structure may be formed in the upper surface of the first liquid-repellent layer 193. The concavo-convex structure in the upper surface of the first liquid-repellent layer 193 has a pattern in which a convex portion and a concave portion are repeatedly arranged. The convex portion may have a width of 0.01 μm to 3 μm, and the concave portion may have a width of 0.01 μm to 3 μm. Since the concavo-convex structure is formed in the upper surface of the liquid-repellent layer 192, a surface roughness may increase to a range between 10 nm and 25 nm, and the liquid-repellent characteristic may be persisted or improved due to the liquid-repellent layer 192 remaining on the pixel defining layer 191.

Figure 11:
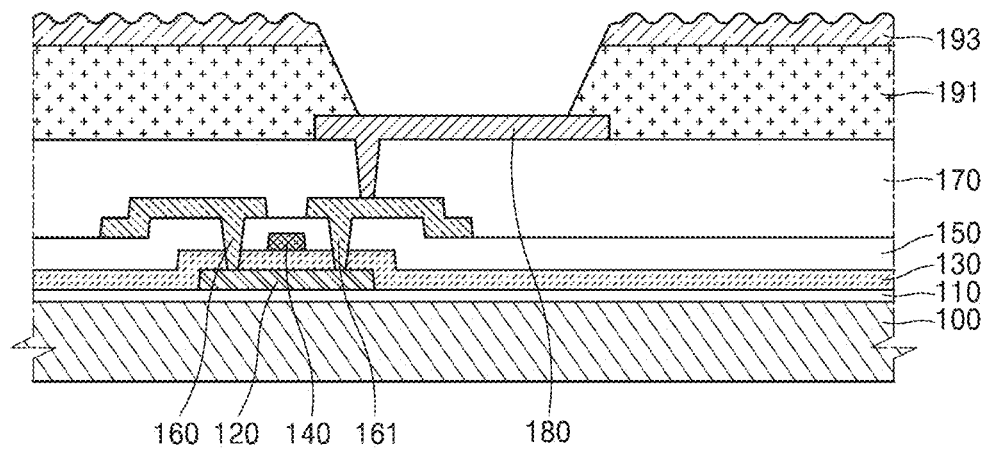
Figure 12:
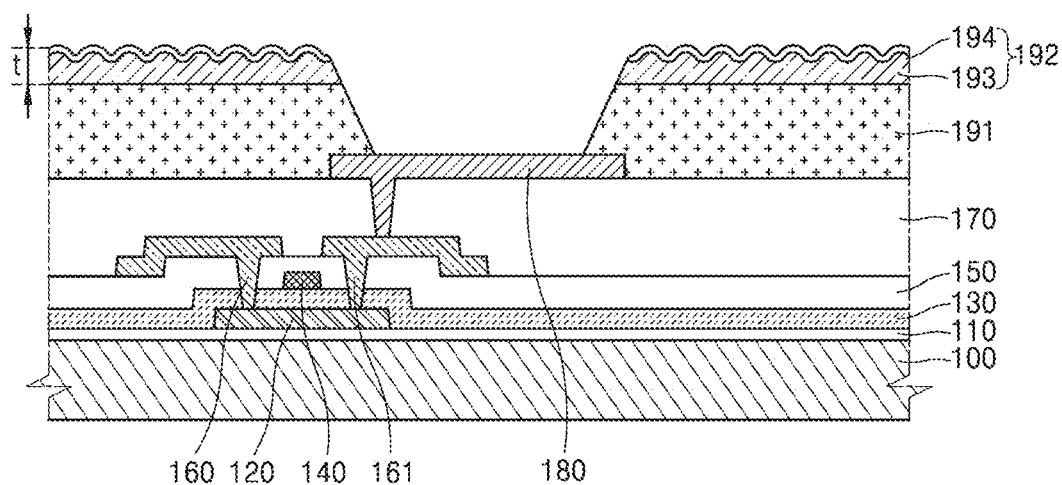
FIG. 12 is a cross-sectional view illustrating some processes in the manufacture of a display apparatus, according to another embodiment.
Figure 13:
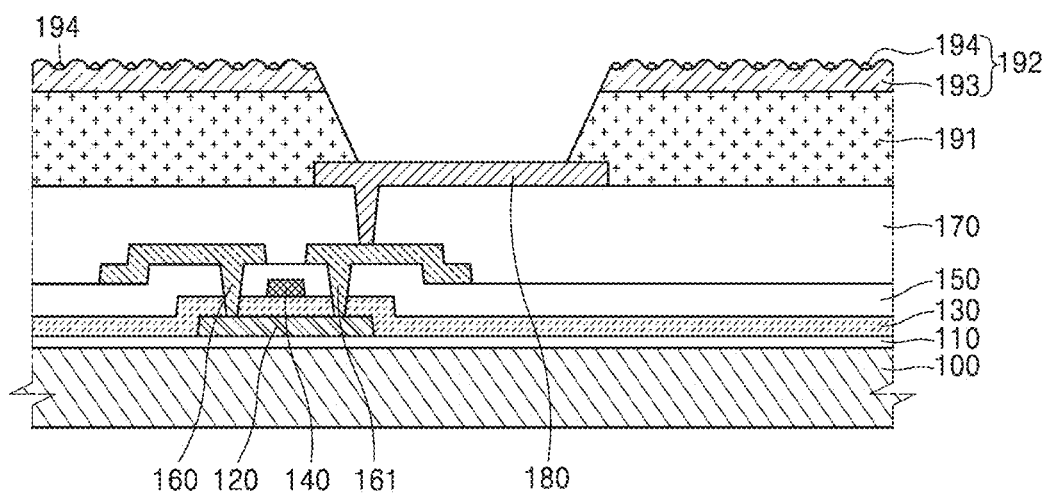
FIG. 13 is a cross-sectional view illustrating some processes in the manufacture of a display apparatus, according to another embodiment.

Referring to FIGS. 11 to 13, according to a degree of removing the second liquid-repellent agent on the pixel defining layer 191, the concavo-convex structure may be obtained differently. FIG. 11 shows that the concavo-convex structure may have only the first liquid-repellent layer 193. FIG. 12 shows that the concavo-convex structure may be obtained by providing the second liquid-repellent layer 194 onto the first liquid-repellent layer 192. Alternatively, FIG. 13 shows that the concavo-convex structure may include the second liquid-repellent layer 194 partially remaining on the first liquid-repellent layer 193.

Even after the irradiating of the plasma to remove the remaining layer 181 from the upper surface of the pixel electrode 180, the remaining layer 181 may partially remain on the upper surface of the pixel electrode 180. In this case, a baking process may be additionally performed to remove impurities remaining on the pixel electrode 180. In addition, the liquid-repellent agent existing in the pixel defining layer 191 may be additionally moved upwardly through the baking process, and thus, the liquid-repellent layer 192 may have a thickness t of about 30 nm to about 70 nm as shown in FIG. 12.

Referring to FIG. 3 and FIG. 6, the intermediate layer 200 including an organic light-emitting layer may be disposed on a portion of the pixel electrode 180 that is exposed via the pixel defining layer 191, and the opposite electrode 210 may be disposed on the intermediate layer 200. The opposite electrode 210 may be integrally provided throughout a plurality of pixels, unlike the pixel electrode 180.

According to an embodiment, the opposite electrode 210 may include a low-reflective layer. Since the opposite electrode 210 is arranged in the light-emitting region AA, as well as in the non-emitting region NAA, the opposite electrode 210 may reduce light reflectivity from the light-emitting region AA to reduce a total light reflectivity of the display apparatus 1.

A thin film encapsulation layer (not shown) may be disposed on the opposite electrode 210. The thin film encapsulation layer may include at least one organic layer and at least one inorganic layer. In the display apparatus 1 of a top emission type according to an embodiment of the present disclosure, the thin film encapsulation layer may be disposed on the organic light-emitting diode OLED, and light emitted from the organic light-emitting diode OLED may be visible from outside through the thin film encapsulation layer.

According to the related art, the liquid-repellent characteristic of peripheral layers may degrade due to some of the manufacturing processes for forming the display apparatus. According to an embodiment, the liquid-repellent layer 192 may include the first and second liquid-repellent agents having different surface energy from each other, and thus, the display apparatus 1 may have an improved reliability in the organic light-emitting diode OLED while maintaining the liquid-repellent characteristics of the peripheral layers (e.g., the pixel defining layer 191).

According to an embodiment, the display apparatus having improved reliability of a light-emitting device (e.g., the organic light-emitting diode OLED) while maintaining the liquid-repellent characteristic of the peripheral layers and the manufacturing method thereof may be provided. However, the scope of the present disclosure is not limited to the above effects.

It should be understood that the exemplary embodiments described herein should be considered in a descriptive sense only and not for purposes of limitation. Descriptions of features or aspects within each embodiment should typically be considered as available for other similar features or aspects in other embodiments. While one or more exemplary embodiments have been described with reference to the figures, it will be understood by those of ordinary skill in the art that various changes in form and details may be made therein without departing from the spirit and scope of the present disclosure as defined by the following claims.

What is claimed is:

1. A display apparatus comprising:
   a substrate;
   a pixel electrode disposed on the substrate;
   a pixel defining layer disposed on the pixel electrode, the pixel defining layer having an opening that exposes a central portion of the pixel electrode; and
   at least one liquid-repellent layer disposed on the pixel defining layer, the at least one liquid-repellent layer including an upper surface having a concavo-convex structure induced by phase separation of two liquid-repellant agents,
   wherein a surface roughness of the at least one liquid-repellent layer is 10 nm to 25 nm,
   wherein the at least one liquid-repellant layer maintains a liquid repellant characteristic after plasma cleaning,
   wherein the at least one liquid-repellent layer comprises a first liquid-repellent layer and a second liquid-repellent layer,
   wherein the second liquid-repellent layer is located on the first liquid-repellent layer,
   wherein the first liquid-repellent layer includes a first liquid-repellent agent and the second liquid-repellent layer includes a second liquid-repellent agent, and
   wherein the first liquid-repellent agent has a first surface energy that is greater than a second surface energy of the second liquid-repellent agent.

2. The display apparatus of claim 1, wherein
   each of the first liquid-repellent agent and the second liquid-repellent agent has a surface energy of 15 dyne/cm or less, and a first surface energy of the first liquid-repellent agent is greater than a second surface energy of the second liquid-repellent agent by 4 dyne/cm to 10 dyne/cm.

3. The display apparatus of claim 1, wherein
the at least one liquid-repellent layer comprises a polymeric material having a molecular weight between 8000 and 20000.

4. The display apparatus of claim 3, wherein
the polymeric material comprises a main chain and a side chain, and a portion of the side chain has cross-linkable binding components with a ratio between 20% and 30% within 100% of side-chain components.

5. The display apparatus of claim 3, wherein
the polymeric material has a glass transition temperature (Tg) of 200° C. or less.

6. The display apparatus of claim 1, wherein
the at least one liquid-repellent layer has a thickness between 30 nm and 70 nm.

7. The display apparatus of claim 1, wherein
the concavo-convex structure has a pattern in which a convex portion and a concave portion are repeatedly arranged, and the convex portion has a first width between 0.01 μm and 3 μm, and the concave portion has a second width between 0.01 μm and 3 μm.

8. The display apparatus of claim 1, wherein
an upper surface of the first liquid-repellent layer has a concavo-convex structure and the second liquid-repellent layer is present on the upper surface of the first liquid-repellent layer.

* * * * *